United States Patent
Bender et al.

(10) Patent No.: US 9,353,457 B2
(45) Date of Patent: May 31, 2016

(54) WEIR METHOD FOR IMPROVED SINGLE CRYSTAL GROWTH IN A CONTINUOUS CZOCHRALSKI PROCESS

(75) Inventors: David L. Bender, Thousand Oaks, CA (US); David E. A. Smith, San Mateo, CA (US)

(73) Assignee: Solaicx, Maryland Heights, MO (US)

( * ) Notice: Subject to any disclaimer, the term of this patent is extended or adjusted under 35 U.S.C. 154(b) by 769 days.

(21) Appl. No.: 13/604,277

(22) Filed: Sep. 5, 2012

(65) Prior Publication Data

US 2013/0233237 A1 Sep. 12, 2013

Related U.S. Application Data

(62) Division of application No. 12/075,513, filed on Mar. 11, 2008, now Pat. No. 8,262,797.

(60) Provisional application No. 60/906,945, filed on Mar. 13, 2007.

(51) Int. Cl.
*C30B 15/12* (2006.01)
*C30B 15/00* (2006.01)
*C30B 29/06* (2006.01)

(52) U.S. Cl.
CPC ............... *C30B 15/002* (2013.01); *C30B 15/12* (2013.01); *C30B 29/06* (2013.01); *Y10T 117/1068* (2015.01); *Y10T 117/1072* (2015.01)

(58) Field of Classification Search
CPC ....... C30B 13/005; C30B 13/08; C30B 13/14; C30B 13/28
See application file for complete search history.

(56) References Cited

U.S. PATENT DOCUMENTS

| | | | |
|---|---|---|---|
| 5,009,863 A | 4/1991 | Shima et al. | |
| 5,474,022 A | 12/1995 | Abe et al. | |
| 5,720,809 A | 2/1998 | Iino et al. | |
| 5,824,152 A | 10/1998 | Kubota et al. | |
| 6,261,364 B1 | 7/2001 | Arai et al. | |

FOREIGN PATENT DOCUMENTS

JP     3-199192     *  8/1991  .............. C30B 15/12

* cited by examiner

*Primary Examiner* — Robert M Kunemund
(74) *Attorney, Agent, or Firm* — Armstrong Teasdale LLP

(57) ABSTRACT

A method is disclosed for continuous CZ crystal growing wherein one or more crystal ingots are pulled into a growth chamber from a crystal/melt interface defined in a crucible containing molten crystalline material that is continuously replenished by crystalline feedstock. The method includes separating the molten crystalline material, controlling the flow of the molten crystalline material and defining an annular space with respect to sidewalls of a heat shield in the chamber.

17 Claims, 6 Drawing Sheets

WEIR METHOD FOR IMPROVED SINGLE CRYSTAL GROWTH IN A CONTINUOUS CZOCHRALSKI PROCESS

CROSS-REFERENCE TO RELATED APPLICATION

This application is a divisional of U.S. patent application Ser. No. 12/075,513 filed on Mar. 11, 2008 now U.S. Pat. No. 8,262,797 which claims the benefit of U.S. provisional patent application Ser. No. 60/906,945, filed Mar. 13, 2007, the entire disclosure of which is incorporated herein by reference.

BACKGROUND

1. Field of the Invention

The field of the invention relates generally to growing single crystal semiconductor material by the Czochralski process. In particular, the field of the invention relates to a continuous Czochralski process employing a tall weir comprising optionally a second weir providing a double weir. The tall weir extends vertically and is configured for providing an optimal flow and velocity of an inert gas, such as argon, to be directed away from the crystal growth region to the melt region, thereby preventing airborne particles or other contaminants from causing dislocations or related defects in the growing single crystal structure. The double weir's function is to properly melt unmelted particles of silicon by ensuring sufficient transit time and optimal crystal growth conditions.

2. Background of Related Art

In a continuous Czochralski (CZ) crystal growth the melt is supplemented at the same time that the crystal is growing. This is in contrast with batch recharge wherein the melt is recharged after the melt is depleted by a completion of a crystal growing and pulling process. In either case the melt can be supplemented either with solid feedstock or molten feedstock.

In contrast to batch recharge, there are advantages of a continuous Czochralski process for growing single crystal silicon ingots. The melt height remains constant and therefore the growth conditions at the melt I crystal interface can be maintained more uniformly for optimal crystal growth. The cycle time is reduced because the melt conditions are not suddenly changed by the addition of a large quantity of feedstock.

In the case of batch recharge, increased cycle time is particularly significant when feedstock must be added in solid form, and this disadvantageously can add up to several hours of equilibration time to the growth cycle. Addition of liquid feedstock particularly in batch recharge reduces the melt equilibration time, but involves the considerable design complications and increased cost of a pre-melter.

A disadvantage of a Czochralski continuous or batch recharge crystal growth is that silicon dust and un-melted particles of silicon, whether from a pre-melter or resulting from the addition of solid feedstock into the melt, are transferred into the melt and growth chamber and can become attached to the growing ingot causing it to lose its single crystal structure.

Silicon feedstock consists of solid chunks, chips or granules that abrade against each other to form small particles and dust. Particularly when solid feedstock is added to the melt, the small particles and dust can be carried into the growth chamber to become suspended in the atmosphere of low pressure argon. The particles and dust can then fall into the melt and cause dislocations in the growing ingot. Smaller size distributions in the solid feedstock are preferred. Adding smaller size chips of feedstock to the melt results in less melt disturbance and splashing. Smaller size feedstock exhibits more controllable flow characteristics in the solid state. In the solid state, smaller particles exhibit more uniform melting characteristics. However, smaller size chips of feedstock are characterized by greater surface area to volume. Thus, the preferred use of such small feedstock material exacerbates the problems of dust. The preferred size distribution is 1-19 mm or more preferably 1-12 mm for small Siemens chip material or 1-3 mm for granular fluidized bed reactor (FBR) material. Unfortunately, these small size distributions are characterized by relatively high levels of small particles and dust which readily can become airborne.

At silicon process temperatures, silicon oxide formed by dissolution of the quartz crucible evaporates from the melt and condenses on slightly cooler areas of the hot zone to form a powder or dust that may become a serious maintenance problem. When this powder or dust falls back into the silicon melt it may affect the growing single crystal structure, causing dislocation defects. Ingot yield and growth economics suffer severely. Therefore, what is needed is a method and apparatus for substantially eliminating airborne particles that may cause defects in the growing crystal.

In a conventional process for continuous crystal growth a weir is often used. The weir typically consists of a quartz tube section, positioned vertically on the floor of the crucible and extending above the melt surface defining a first inner growth region and a second outer melt supplementing region with one or more subsurface passageways connecting the foregoing first and second melt regions. Such a conventional weir arrangement is shown in FIG. 1.

While this arrangement may be adequate for limiting transmission of un-melted particles of silicon from the melt supplementing region to the crystal growth region, such conventional weir arrangements fail to address the problem of dust particles which can be carried over the weir by aerostatic forces, or otherwise become airborne, and land in the growth region with destructive effects on crystal structure.

The problem of silicon dust adversely impacting the conventional CZ crystal growing process is expected to increase in severity as the solar power industry turns to processing of recycled silicon.

Solar cell production is presently constrained by the high cost and lack of availability of input polysilicon raw material. The single crystal ingot grown in a Czochralski process is necessarily grown with a conical top and conical tail. Pot scrap is necessarily left in the crucible when the ingot is removed. Furthermore, the round cross section of the ingot body must be converted to a square or pseudo-square cross section to provide silicon wafers in the form of tiles for optimal area coverage in a solar module. Thus, ear or slab shaped sections must be removed from the ingot to create the square or pseudo-square cross section. These bi-product materials must be recycled for lowest possible wafer cost, and in so doing they must be broken up and re-sized into small chunks or chips. The breaking up process necessarily creates small particles and dust.

Therefore, what is needed is an improved CZ grower that is compatible with silicon recycling processes and is capable of using the silicon produced from re-sized byproduct materials. Such an improved CZ grower ideally must be capable of economically processing recycled silicon, such as tops, tails, slabs and pot scrap while substantially eliminating the problem of unmelted particles and dust landing in the growth zone to cause dislocation defects in the growing crystal.

Other problems of conventional CZ growers also adversely impact their ability to economically process recycled silicon to produce high purity silicon ingots free of dislocation defects that are demanded by higher efficiency solar cells. For example, conventional weirs, being made from quartz, are subject to the formation of silica particulates that can float away from the surface of the quartz into the growth region and destroy crystal structure. Quartz softens at temperatures commonly encountered in a crucible for holding molten silicon. Conventional quartz weirs deform, thereby leading to operational problems.

A further problem of conventional uncoated weirs is that melt vibrations induced by interaction between the melt and weir walls causes dislocations in the growing ingot.

SUMMARY

In order to overcome the foregoing limitations and disadvantages inherent in conventional Czochralski process weir arrangements, an aspect of the invention provides a weir extended vertically such that an optimal annular gap is created between the top of the weir and the underside of a super-adjacent heat shield. The annular gap between the top of the weir and the bottom of the heat shield is configured to provide a high velocity stream of argon gas to be directed from the growth region to the melt region to substantially eliminate the possibility of airborne particles making their way from the melt region to the growth region.

In another aspect of the invention, the diameter of the weir is chosen so as to provide sufficient melt volume in the melt region such that the latent heat of fusion and thermal energy necessary to take the solid feedstock up to the melting temperature silicon 1412° C. does not cause freezing of the melt in the melt region.

Another aspect of the invention provides a double weir arrangement, wherein first and second weirs define an outer and inner melt region, respectively, separated from the growth region. One or more submerged, flow controlling passageways provided in the weirs control the flow of melt from outer melt region to the inner melt region and into the growth region. The weir passageways effectively increase the path length and transit time for molten silicon feedstock to ensure complete melting of all particles in the melt.

A further aspect of the invention provides a labyrinthine flow path between the growth region and the melt region for an inert gas such as argon. Materials for the labyrinth are selected to withstand the high temperature, reactive environment without contributing impurities to the melt. The exit from the labyrinth is designed to optimally distribute the argon gas flows over the surface of the melt to sweep away silicon oxides evolved from the melt into the exhaust manifold system, preventing those oxides from depositing on critical surfaces from which they could drop down into the melt as particles which would lead to dislocation and other defects in the growing single crystal structure.

Another aspect of the invention provides a double weir arrangement including a devitrification promoter applied to the outer surfaces of the weirs to form a ceramic shell that provides mechanical reinforcement and prevents slumping or distortion of the weirs. Such a coating advantageously limits the formation and detachment from the weir or weirs of cristabolites as well as limits the introduction of impurities into the melt. The devitrification promoter applied to the outer surface of the weirs (especially those outer surfaces in contact with the melt) substantially eliminates vibrations in the melt which otherwise would cause dislocations in the growing ingot.

A plurality of independently controllable annular heaters 219 are positioned beneath the melt. An outer annular heater is positioned generally beneath the melt region to counterbalance the latent heat of fusion in that region. One or more heaters are centrally disposed beneath the weirs to counteract the insulating effect of the weirs and thus advantageously provide controllable, stabilized heating and thermal gradient in the growth region.

Another aspect of the invention provides a modular, reusable weir extension that is supportably engaged with an outer (and I or inner) weir to thereby provide an extended weir forming an annular gap of optimal width with respect to an adjacent heat shield for substantially eliminating transport of dust particles into the growth chamber. The modular weir may be coated with barium or other devitrification promoter and is removable. Modularity achieves considerable cost savings, enabling reuse of the weir extension after the supporting weir (or weirs), immersed in the silicon melt, would need to be replaced due to the highly corrosive nature of molten silicon.

The foregoing aspects of the invention, by preventing dust particles from causing dislocation defects in the growing ingot, enable direct utilization of recycled sources of silicon as feedstock; and thereby achieve an economic solution for producing high purity silicon wafers for solar cells from recycling tops, tails, slabs and pot scrap bi-product materials, or the like.

BRIEF DESCRIPTION OF THE DRAWINGS

The drawings are heuristic for clarity. The foregoing and other features, aspects and advantages of the invention will become better understood with regard to the following description, appended claims and accompanying drawings in which:

DETAILED DESCRIPTION

Figure 1:
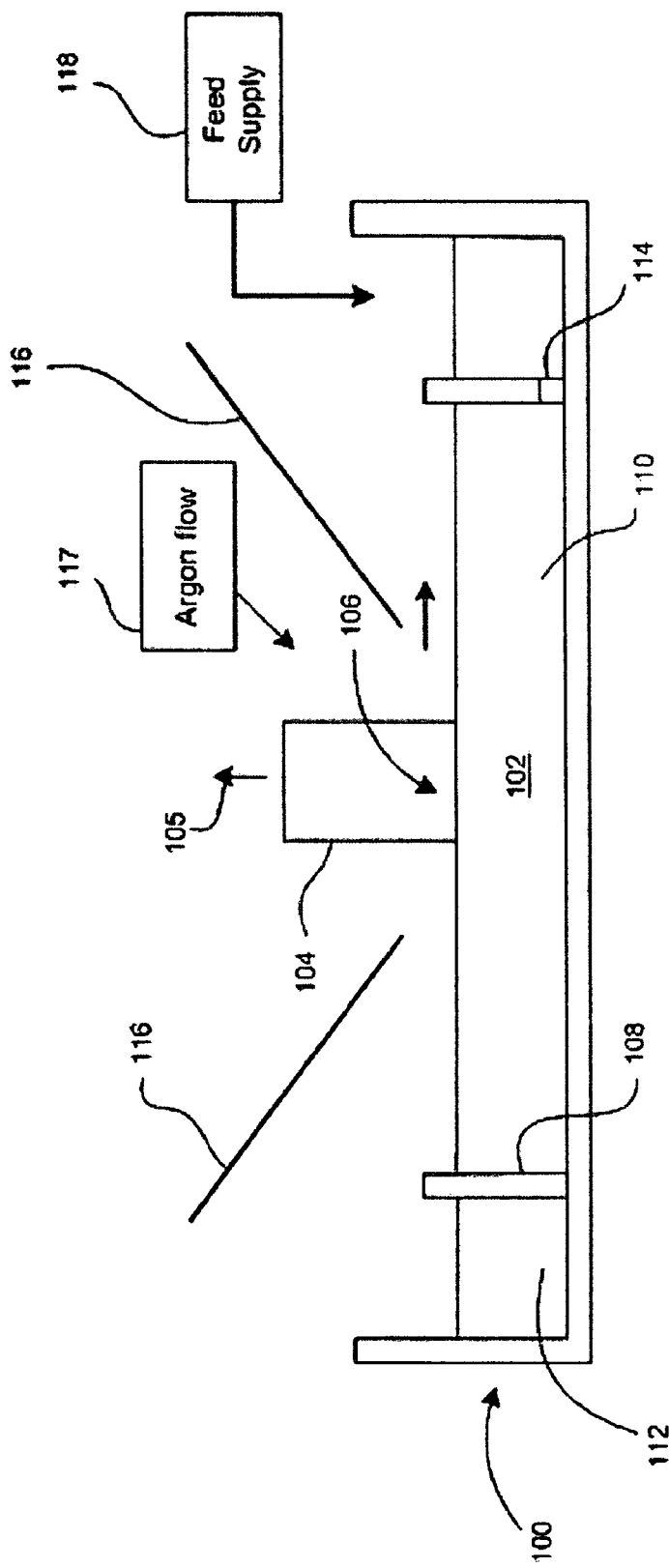
FIG. 1 is a schematic diagram showing a conventional high aspect ratio crucible with peripheral heaters in a Czochralski crystal growing system.

Referring to FIG. 1, in a conventional Czochralski system, a crucible 100 holds a quantity of molten silicon 102 in which a single crystal ingot 104 is grown and pulled in a vertical direction indicated by arrow 105 from a crystal I melt interface 106 as is well known. A weir 108 typically comprising a quartz cylinder is positioned on the floor of the crucible 100 and extends vertically above the melt as shown.

The weir 108 defines an inner growth region 110 and an outer melt supplementing region 112. One or more subsurface passageways 114 connect the first or melt supplementing region 112 with the inner growth region 110.

A heat shield 116 is typically conical in shape and depends downwardly at an angle to create an annular opening disposed about the growing crystal or ingot 104 to permit the growing ingot to radiate its latent heat of solidification and thermal flux from the melt. The top of the heat shield has a first diameter much wider than the diameter forming the annular opening around the ingot 104. The top of the heat shield is supportably held by the insulating lid or insulation pack as is well known. The insulating lid is omitted from the drawing for the sake of simplicity.

A flow of an inert gas, such as Argon is typically provided along the length of the growing crystal as indicated at 117. The details of the Czochralski growth chamber are well known and are omitted for the sake of simplicity.

A feed supply 118 provides a quantity of silicon feedstock to the melt supplement region 112 of the crucible as is well known. The silicon feedstock may be in the form of solid chunks of silicon feedstock provided directly to melt region 112. In either case, addition of feedstock to the melt region is often accompanied by particles of dust transported by aerostatic forces over the top of weir 108. The dust or unmelted silicon particles contaminate the growth region 110 and can become attached to the growing ingot, thereby causing it to lose its single silicon structure.

While the conventional weir arrangement of FIG. 1 may limit transmission of dust and un-melted particles of silicon by means of melt flowing from the melt supplementing region to the crystal growth region, it fails to address the problem of dust particles that can be borne over the weir, land in the growth region and destroy crystal structure. A conventional quartz weir also is subject to the formation of silica particulates that can float away from the surface of the quartz into the growth region and destroy crystal structure.

Solid silicon feedstock normally would be expected to incorporate rapidly into the melt. However, solid particles floating on the melt surface have different emissivity (approx. 0.8) from the emissivity of the liquid melt (0.3). Therefore, solid particles radiate energy and do not melt. They continue to float due to their density and stay cooler because of their emissivity. Particles, including oxides may be transported by aerostatic forces over the top of the weir, land in the growth region and preferentially migrate to the melt I crystal interface where they cause dislocations in the growing ingot.

The presence of oxide coated silicon particles is related to the silicon feedstock. Considering the granular nature of the silicon feedstock, the presence of small contaminating articles is virtually assured. Vendors of silicon feedstock provide fine-grained silicon at substantially lower prices. However, as the size of silicon feed stock becomes smaller, the proportion of native oxide coating to the contained silicon increases rapidly and non-linearly. Thus, silicon dust and un-melted particles of silicon, whether from a pre-melter or resulting from the addition of solid feedstock into the melt, can be transferred into the melt and can become attached to the growing ingot causing it to lose structure. Contamination by oxide particles is a serious problem in a conventional Czochralski process.

Figure 2A:
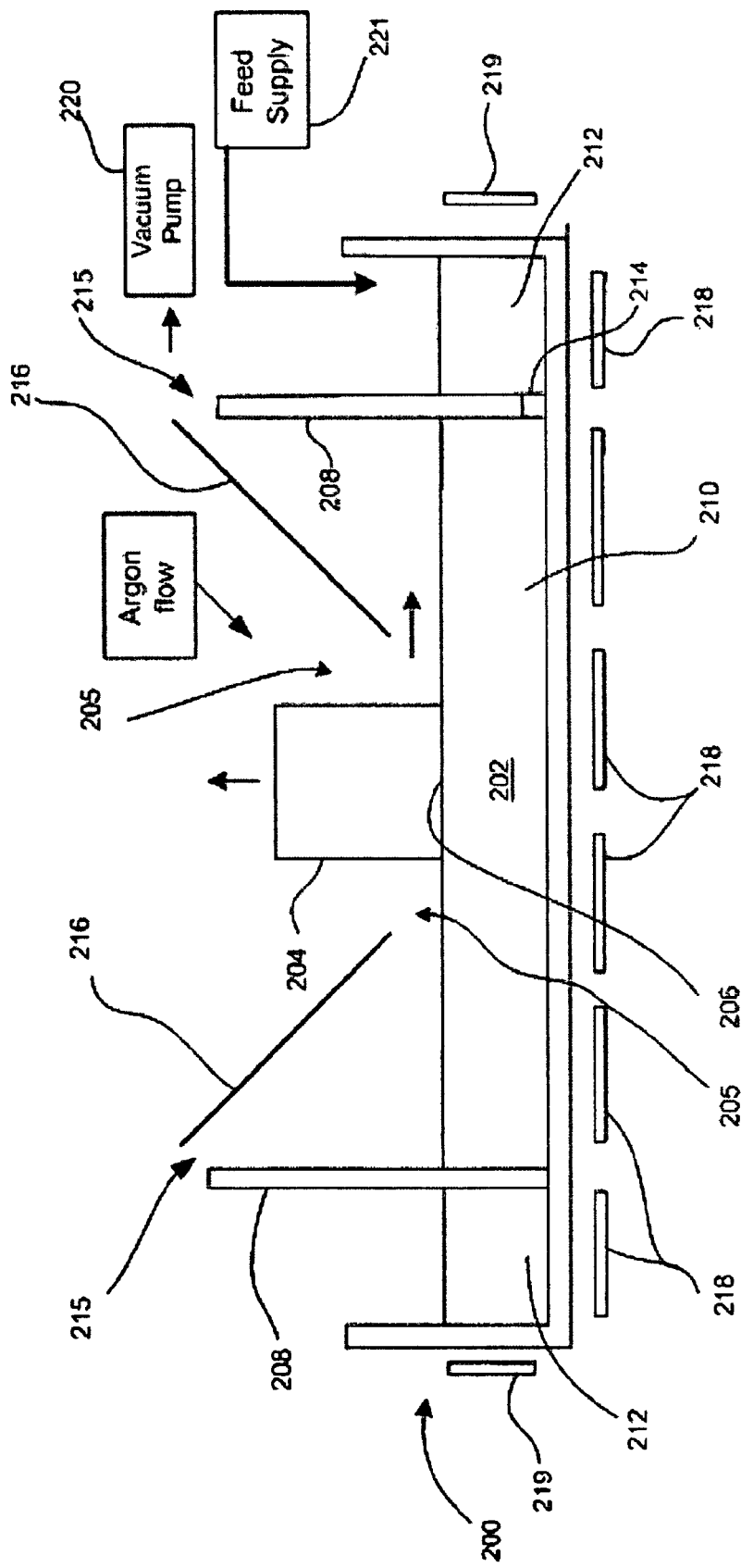
FIG. 2A is a schematic diagram showing a side sectional view of an extended weir providing an optimal annular gap between the top of the weir and the underside of the heat shield in accordance with an aspect of the invention.

Referring to FIG. 2A, in accordance with an aspect of the invention, a tall weir 208 is provided in a shallow, a low aspect ratio crucible 200 as set forth in co-pending U.S. Ser. No. 10/789,638, now U.S. Pat. No. 7,635,414, incorporated herein by reference. The tall weir 208 is generally a cylinder having sidewalls supported on the bottom of the crucible that extend upwardly to define the growth region 210 in silicon melt 202. The tall weir 208 divides the melt into two portions, an inner growth region 210 and an outer, feed supplement region 212. That is, the cylindrical weir separates the growth region 210 from a first region or melt supplement region 212 to isolate and prevent thermal and mechanical perturbations from affecting the growing crystal in the growth region 210. The tall weir 208 also defines a passageway 214 for controlling melt flow between the melt supplement region 212 and growth region 210. A feed supply 221 supplies a source of solid silicon feedstock to melt supplement region 212.

The crucible containing the tall weir is provided in a growth chamber as described in co-pending U.S. Ser. No. 10/789,638, now U.S. Pat. No. 7,635,414, incorporated herein by reference. The growth chamber is well-known and is omitted from FIG. 2 for the sake of clarity. Heat shield 216 is typically conical in shape and depends downwardly at an angle to create an annular opening 205 disposed about the growing crystal or ingot 204 to protect the crystal/melt interface 206 and the ingot 204 from extreme thermal perturbations. The top of the heat shield 216 has a first diameter much wider than the diameter forming the annular opening 205 around the ingot 204. The top of the heat shield is supportably held by the insulating lid or insulation pack as is well known. The sidewalls of the conical heat shield 216 depend downwardly from the base and at an angle such that a smaller diameter distal end of the heat shield defines a central annular opening 205, large enough to receive the growing ingot, as the single crystal ingot 204 is pulled vertically as shown.

The heat shield 216 can be made from molybdenum or graphite with optional silicon carbide or similar coating. It can be single layer or multilayer with intervening layers of thermal insulation such as graphite fiber. Multilayer construction or insulation increases insulating effect of the heat shield, making it more effective such that the ingot can lose heat more readily. The preferred angle of the heat shield is chosen to provide optimal heat shielding of the ingot. That is, the heat shield both absorbs radiation from the ingot and radiates back to it. As the angle approaches vertical, the heat shield maximizes incident radiation normal to the ingot and lessens the ability of the ingot to lose latent heat of solidification. The annular opening 205 defined by the diameter of the lower peripheral edge of the conical heat shield is important relative to the diameter of the growing ingot. The annular opening defines an annulus of melt which can radiate at the ingot without shielding by the heat shield, thereby preventing the ingot from losing latent heat of solidification. Optimally angled heat shields maximize pull speeds and crystal quality.

The tall weir 208 comprises a generally cylindrical shaped body supported on the base of the crucible 200. The sides of the weir 208 extend vertically upward to form and define an annular gap 215 with the underside of conical heat shield 216. It will be appreciated that the annular gap 215 between the top of the weir 208 and the underside of the heat shield 216 is optimized to limit the entry of dust particles into the growth region. The dimensions of the annular space or gap 215 are chosen such that the extended sides of the tall weir 208 in combination with the adjacent heat shield 216 provide an enhanced flow path for the outflow of the argon purge gas from the ingot. That is, the annular gap 215 is dimensioned to provide a narrowed, focused flow path for the outflow of the purge gas and has the effect of increasing the pressure of the outflow purge gas with respect to incoming contaminant particles evolved from the melt region 212. This advantageously overcomes aerostatic forces transporting contaminating particles to the growth region. Contaminating dust particles are transported or dispersed by the purge gas flow where they settle in non-critical areas under the action of gravity.

An optimal dimension for the annular gap defined by the extended sidewalls and heat shield above is in the range of from 5 mm to 20 mm. Most preferably the annular gap 215 is in a range of from 10 mm to 15 mm.

Figure 2B:
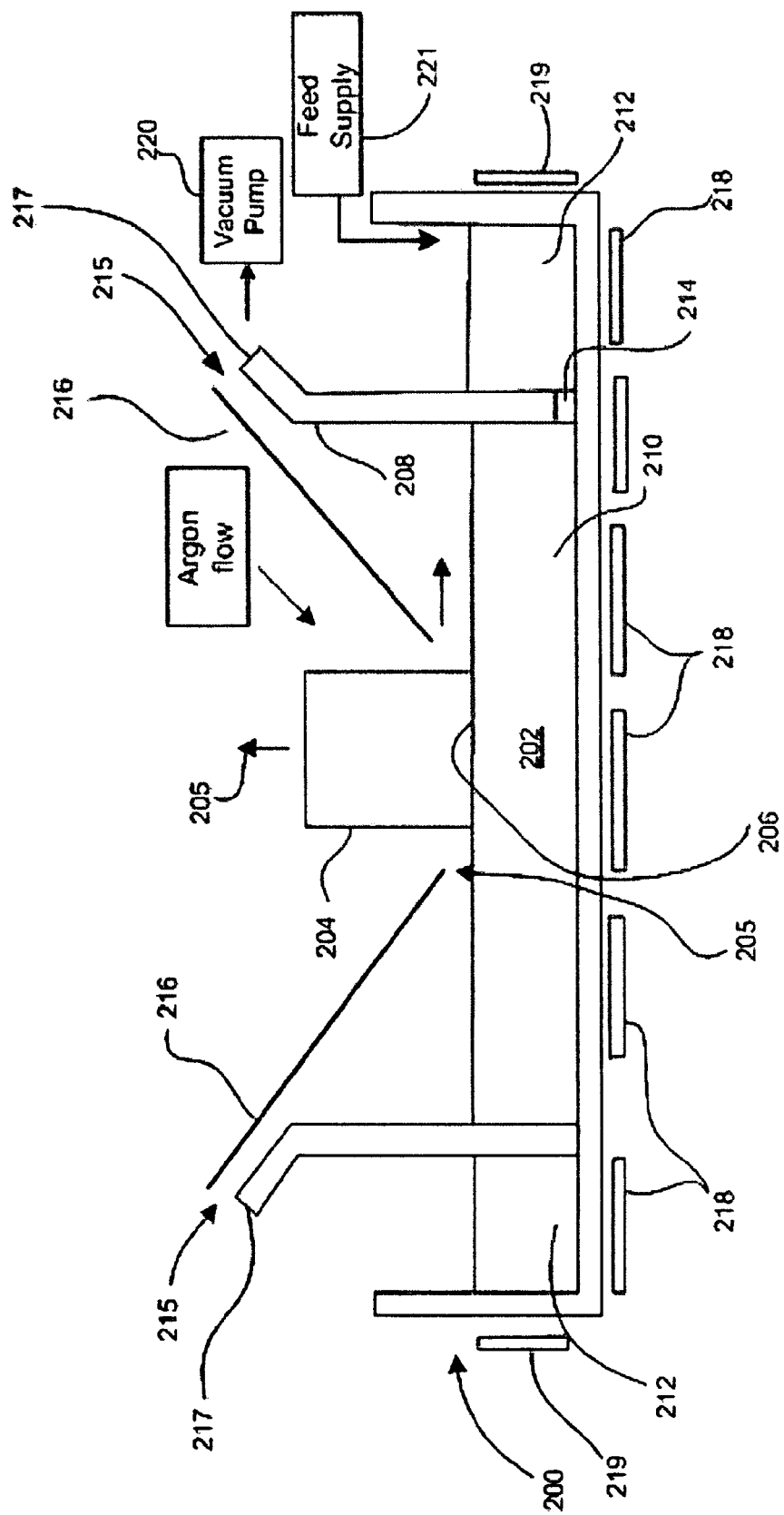
FIG. 2B is a schematic diagram showing a side sectional view of an alternate embodiment of FIG. 2A in accordance with an aspect of the invention.

Referring to FIG. 2B, additional embodiments for defining a flow path and focusing the outflow of the purge gas for enhancing the settling of dust particles out of the critical growth region include an extended weir wherein the distal ends of the sidewalls of the weir adjacent the heat shield are widened or extended outwardly in parallel with the heat shield so as to form an annular rim 217 defining an extended annular flow path through a gap between the rim and the underside of the adjacent heat shield. The annular rim 217 increases the velocity of the outflow gas through the gap to overcome the inflow of contaminants.

The optimally dimensioned gap defined by the annular rim is a distance in a range of from 5 mm to 20 mm from the underside of the heat shield. The rim can be from 10 mm to 100 mm in length.

The diameter of the weir 208 is chosen so as to provide sufficient melt volume in the melt region 212 such that the latent heat of fusion and thermal energy necessary to take the solid feedstock up to the melting temperature silicon 1412° C. does not cause freezing of the melt in the melt region.

The diameter of the weir 208 must also not be too small to obviate the benefits of optimal melt temperature distribution and reduced convection currents in crystal growth in a low aspect ratio crucible with heaters underneath as is well known. See for example published PCT patent application WO 2005/08425 A2.

A plurality of independently controlled annular heaters 218 are disposed in a radial pattern beneath the base of the crucible 200 in addition to side heaters 219, to provide a much more controlled temperature distribution through melt 212. Annular base heaters 218 apply heat in a more controlled distribution across the entire base surface area of the crucible. The annular base heaters 218 are preferably planar resistive heating elements that are individually controlled as described in co-pending U.S. patent application Ser. No. 10/789,638, now U.S. Pat. No. 7,635,414, which is incorporated herein by reference.

An operational example applying the foregoing considerations is as follows. In the case of a 32" diameter crucible the weir diameter is preferably between 16" and 24" in diameter. Argon flowing downwards from the upper part of the growth chamber and first flowing around the body of the growing ingot is first deflected upwards by the inside walls of the weir and is drawn by one or more vacuum pumps 220 through the annular gap between the top of the weir and the underside of the heat shield 216 causing a high stream velocity of argon through the annular gap 215 from the growth region 210 to the melt region 212. Addition of feed into the melt region may be accompanied by airborne particles as described above.

It will be appreciated that this configuration of a tall weir providing an optimal annular gap between the top of the weir and the bottom of the heat shield, induces a resulting high stream velocity of argon gas directed from the growth region to the melt region and substantially eliminates the possibility of airborne particles making their way from the melt region to the growth region.

Figure 3:
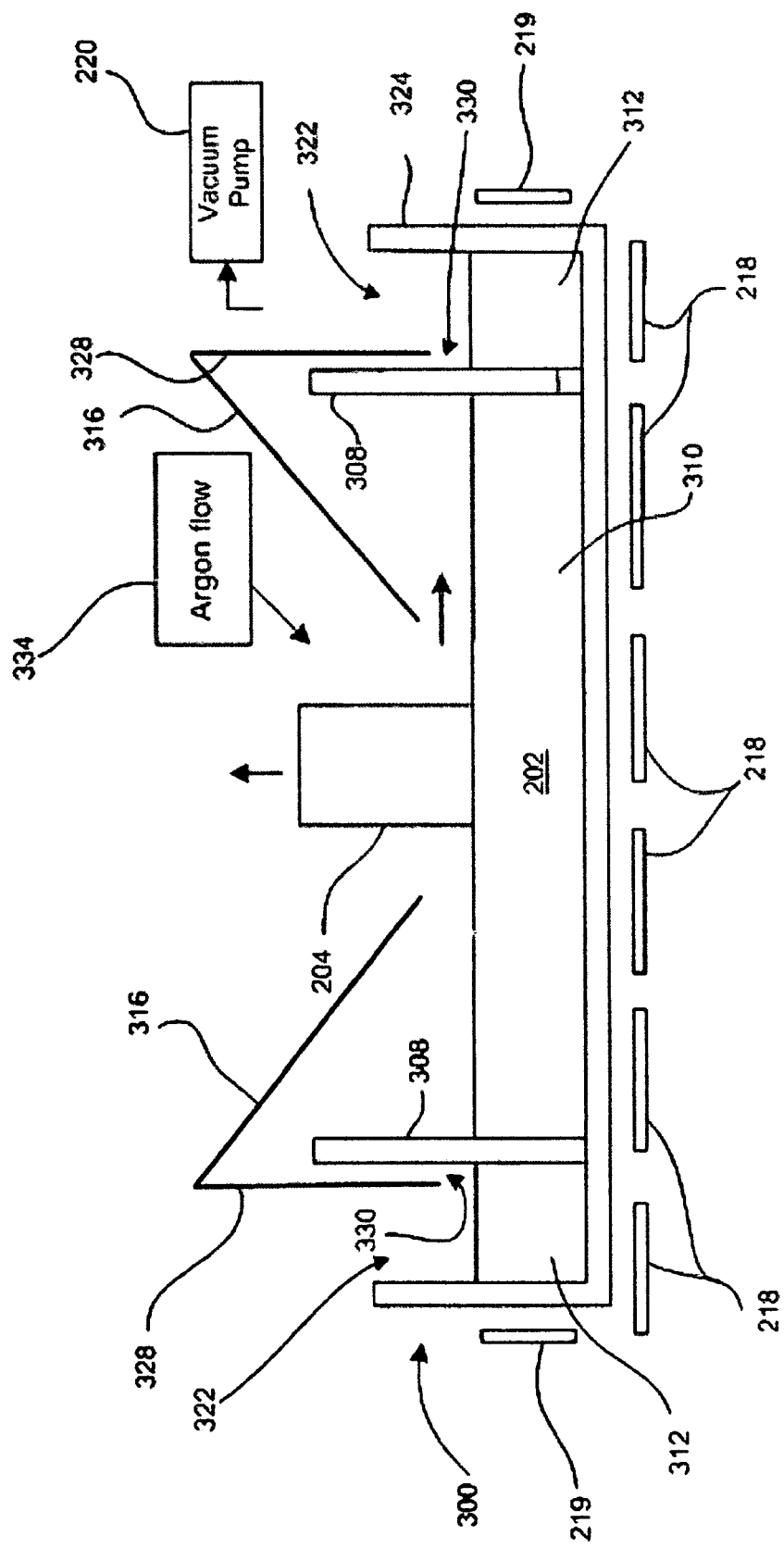
FIG. 3 is a schematic, side sectional diagram showing a hot zone modification comprising a cylindrical body depending vertically from the heat shield and configured for providing an optimal flow of argon such that oxides are purged from the surface of the melt in accordance with an aspect of the invention.

Referring now to FIG. 3, a somewhat shorter cylindrical weir 308 can be used provided that modifications are made to the hot zone. The hot zone generally comprises the region above melt region 312. The heat shield 316 is provided with an additional downwardly depending wall that forms a cylinder 328 concentric with the sides of cylindrical weir 308. Downwardly depending wall 328 in conjunction with sides of cylindrical weir 308 define an annular concentric gap 330. Annular concentric gap 330 forms a restricting channel or flow path that results in a higher velocity stream of argon gas flow. Argon flowing downwards from the upper part of the growth chamber and first flowing around the body of the growing ingot is first deflected upwards by the heat shield 316 and inside walls of the weir 308 and is drawn by one or more vacuum pumps 220 as described above. The vacuum pump provides a means for directing the flow of argon or other purge gas into a flow path that results in a higher velocity stream of argon gas flow away from the growing ingot and out of the growth chamber. Thus, annular concentric gap 330 provides a flow path out of the growth region 310, and down into hot zone 322 for the stream of relatively high velocity purge gas.

An example of such of hot zone modification is cylindrical body 328 as shown in FIG. 3 depending from the heat shield 316 with a diameter slightly larger than that of weir 308. The bottom edge of the cylindrical body 328 depends vertically substantially in parallel with and below the top of the cylindrical weir 308. The parallel concentrically disposed cylindrical walls of cylindrical body 328 and cylindrical weir 308 define a higher velocity, labyrinthine flow path for the outflow of argon gas from the growth zone 310 through annular concentric gap 330 formed between the adjacent walls of the concentric cylindrical body 328 and weir 308.

Contaminants borne by aerostatic forces can be prevented from entering the melt by reason of the labyrinthine shape of the flow path through 330 for argon 334 or other purge gas as indicated in FIG. 3. It will be appreciated that the length of cylindrical body 328 and distance apart from adjacently concentric sidewall of weir 308 can be varied to provide various flow characteristics for flow path through 330 for the exhaust of argon or other purge gas from the growth region 310 to the melting region 312 in order to achieve optimal sweeping of oxides evolved from the silicon melt 302.

Materials defining the labyrinthine flow path need to withstand the high temperature hostile environment and at the same time not contribute to impurities in the melt. The components defining the labyrinthine flow path (heat shield 316, downwardly depending cylindrical body 328 and adjacent, concentric sidewalls of weir 308) could for example be formed from suitable molybdenum sheet or spun molybdenum material. Spun molybdenum material is available from suppliers such as PLANSEE Metall, GmbH, A6600 Reutte I Tirol, Austria (http//:www.plansee.com). Further, the exit from the labyrinthine flow path 330 can be designed to optimally distribute the argon gas flows over the surface of the melt to sweep away silicon oxides evolved from the melt into the exhaust manifold system, preventing those oxides from depositing on surfaces onto which they could deposit and then drop down into the melt as particles which would when entering the growth region, to potentially lead to loss of single crystal structure.

Another aspect of the invention provides a solution to the problem of slumping or loss of mechanical support in critical components, particularly with respect to tall quartz weirs. Quartz can soften and flow easily at temperatures above 1800° K, thus requiring for graphite susceptors to support the crucible. (See for example U.S. Pat. No. 5,306,474 that describes the use of mechanical reinforcing brackets to support a weir to prevent it from slumping.)

As is well known to those skilled in the art, and as described for example in Hansen et al., U.S. Pat. No. 5,976,247, a devitrification promoter such as barium compound applied to the inner surface of a quartz crucible containing a silicon melt acts to promote uniform dissolution of the surface and to promote crystalline nuclei. The crystalline nuclei grow rapidly to confluence to form a continuous ceramic shell and in so doing reduce the release of crystalline silica particulates into the melt and thereby improve zero dislocation performance in the growing ingot. A devitrification promoter applied to the outer surface of the crucible similarly forms a ceramic shell that acts to mechanically reinforce the crucible wall and limits slumping.

A need for a devitrification promoter did not exist and was not recognized for a weir in a conventional Czochralski batch process for single crystal silicon growth. However, it has been found that a devitrification promoter can be applied to a weir placed within the melt, and such use is particularly advantageous when used in conjunction with a tall weir for providing the optimal annular gap for substantially eliminating airborne particles as shown in FIG. 3 and envisaged in the current invention.

A conventional CZ grower, particularly for a batch recharge process, generally is characterized by a high aspect ratio crucible, (depth in relation to diameter) resulting in a deep melt and therefore increased height and cost for a tall weir necessary to contain the melt. In such a conventional CZ grower, a lift mechanism is provided beneath the crucible to lift the crucible as the silicon ingot is grown. The lift mechanism mitigates against maintenance of a constant air gap with an overlying heat shield. To the extent conventional crucibles employ weirs, the weir typically divides the melt into an outer annular melting or "feed" zone and a center crystal growth zone. The weir controls mixing of introduced silicon feed material and dopant in the melting zone such, that the ratio of dopant in the melting zone to dopant in the growth zone is less than the segregation coefficient to thereby control doping of the growing ingot. An example of such a conventional weir is shown in Nagai et al., U.S. Pat. No. 5,900,055, issued May 4, 1999.

Thus, to the extent a weir is employed in a conventional CZ process, the weir's purpose is primarily for controlling temperature and dopant distribution in the melt. The use of a tall weir as a means for creating an annular gap with respect to an adjacent heat shield for substantially preventing airborne contaminants from entering the growth chamber has been, up to now, entirely unrecognized.

It has also been found that use of a devitrification promoter with a tall weir 308 not only improves zero dislocation performance, but also provides the additional benefit of avoidance of slumping which would dangerously impede the rotation of the crucible and otherwise interfere with safe operation of the crystal grower.

It will be appreciated that while the foregoing weir arrangement with a devitrification promoter may be used most advantageously in continuous Czochralski crystal growth, it also may be used to advantage in batch recharge growth, either with solid feed supplement or liquid feed supplement.

Figure 4:
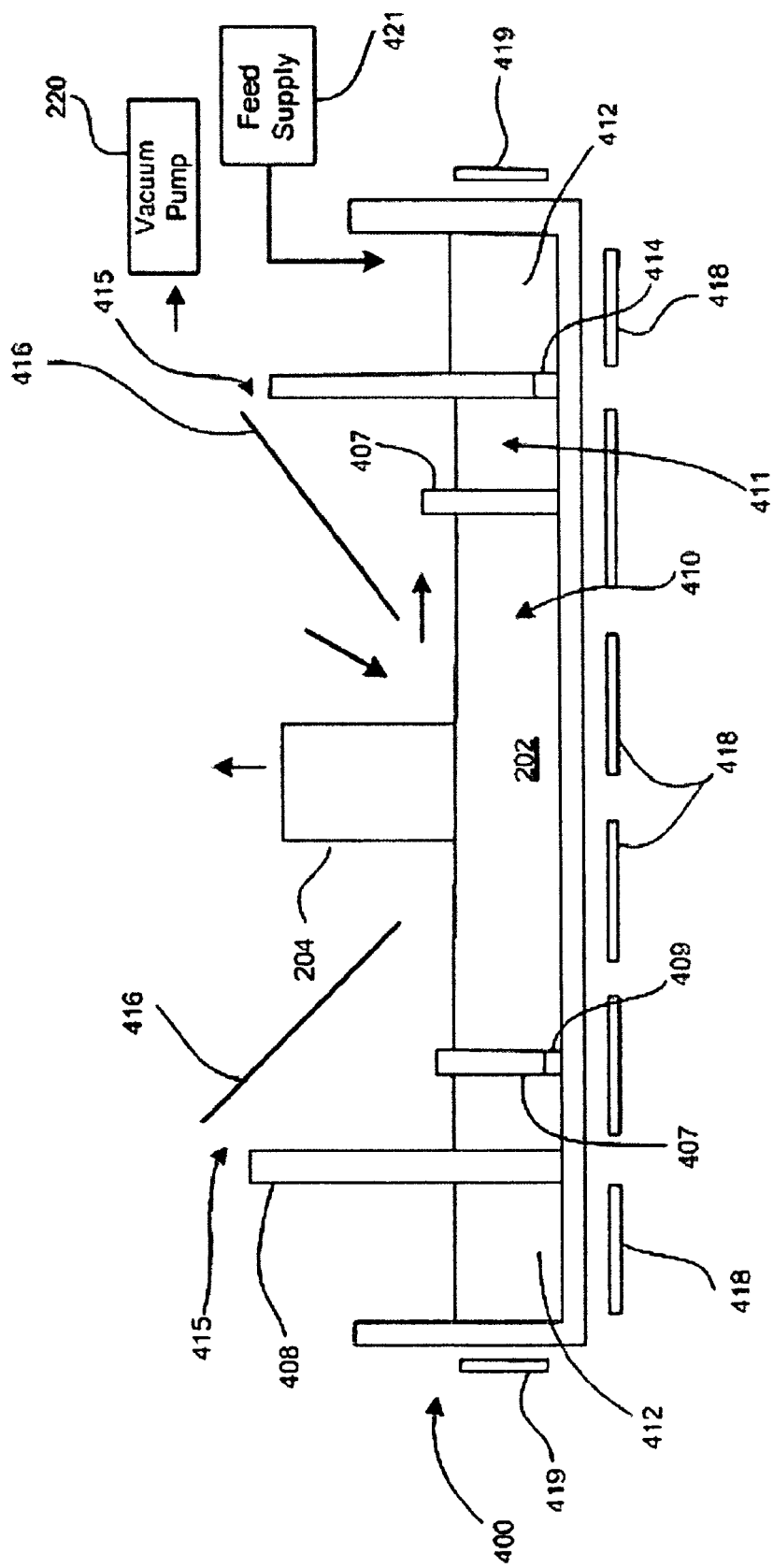
FIG. 4 is a schematic diagram showing a side sectional view of a double weir arrangement wherein a second weir concentric with an outer weir provides an extended, serpentine melting path of increased length for substantially eliminating unmelted particles and minimizing temperature fluctuations in accordance with an aspect of the invention.

Referring to FIG. 4, according to an aspect of the invention, it has been found extremely beneficial in a continuous Czochralski growth process to have a second inner weir 407 in addition to a first outer weir 408. The second inner weir 407 creates an interconnecting region 411 between the outer melting region 412 and the central growth region 410 in the melt. Feedstock, whether in solid or liquid form, added in at 421 to the outer melting region 412 of the crucible needs to be fully molten before it arrives in the central growth region 410. Small particles in the central growth region 410, particularly oxides of unmelted silicon feedstock as previously explained, can attach themselves to the growing ingot and cause dislocations. In addition, the melt in the critical growth region 410 should be devoid of large local temperature fluctuations that can cause dislocations in the growing crystal 404.

A plurality of annular resistive heating elements 418 are disposed in a radial pattern beneath the low aspect ratio crucible 400. Additional resistive heating elements 419 are disposed around the circumference of the outer wall of crucible 400. Annular heating elements 418 and sidewall heating elements 419 are individually controlled (as set forth in co-pending U.S. Ser. No. 10/789,638, now U.S. Pat. No. 7,635,414, incorporated herein by reference) to generate separate heating zones. Each thermal zone corresponds to the thermal output of a separately controlled resistive heater element 418. It will be appreciated that heating elements 418 thus provide a series of controllable thermal zones representative of an optimal thermal distribution across the melt. Such controllable thermal zones have been found to be especially advantageous in overcoming and compensating for the insulating effect of the two weirs 407 and 408 due to increased surface area of contact between melt and quartz surfaces. Thus, the heating elements maintain an optimal temperature distribution across the melt despite the added mass of the two weirs.

The second inner weir 407, concentrically disposed with respect to the outer weir 408, defines a second inner melt region 411. Second weir 407 is also provided with one or more submerged flow controlling passageways 409 connecting the melt region 412 to the inner growth region 410. The outer weir 408 is similarly provided with one or more passageways 414 for controlling the flow of melt from outer melt region 412 to region 411. The second weir 407 defining passageway(s) 409 effectively increases the path length for molten silicon feedstock to travel between the outer melting region 412, the first passageway 414 defined by first or outer weir 408 and the central growth region 410. Thus, material from feedstock supply 421 added into the outer melting region 412 takes longer to travel to the central growth region and the increased path length creates more time and opportunity for substantial elimination of un-melted particles. Large temperature fluctuations in the melt in the inner growth region caused by the addition of solid material into the outer melting region are also advantageously substantially eliminated. In effect, the second weir 407 defining passageway(s) 409 and an elongated path from the outer melt region create a thermal buffer between the outer melting region 412 and central or growth region 410 of the melt.

The foregoing effect of creating a thermal buffer with maximized melting of silicon in the melt region and minimized temperature fluctuations in the critical growth region can be optimized further by arranging a passageway or passageways 414 through the outer weir 408 such that there is an offset with respect to the passageway or passageways 409 through the second, inner weir 407. For example, in the case of a single passageway in each weir the offset can be 180 degrees, or in the case of two passageways the offset can be 90 degrees. Combinations of one passageway in the one weir and two passageways in the other weir offset by 90 degrees are also possible.

It has been found to be especially important to use a low aspect ratio crucible when employing the double weir in accordance with the foregoing aspect of the invention. Maintenance of an optimal annular gap 415 between weir 408 and the heat shield 416 during ingot growth is possible only with a fixed crucible position. That is, the crucible 400 is not raised during ingot growth to maintain the melt level at approximately the same position with respect to heaters. According to an aspect of the invention, the use of a double weir arrangement is much more practicable with a low aspect ratio crucible which provides sufficient lateral width and volume into which to sub-divide the melt into outer melting region 412, inner growth region 410 and middle interconnecting region 411 with sufficient melt volume in each region for respective melt regions to perform their required function.

In Czochralski crystal growth, oxygen is transported into the silicon melt through dissolution of quartz from the crucible and weir, the $SiO_2$ of the quartz becoming mobile silicon and oxygen atoms. The oxygen either evolves from the melt surface or is taken up into the growing crystal. Uptake into the growing crystal is favored since the segregation coefficient is greater than unity. Unfortunately, high levels of oxygen ($>10^{18}$ atoms/cm$^3$) in the ingot have an adverse effect on minority carrier lifetime and hence conversion efficiency of solar cells (silicon wafers) made from the ingot. In fact, the lower the oxygen concentration in the ingot, the better the conversion efficiency of a solar cell made from the ingot. This is due to a process of dynamic equilibrium, with quartz continuously dissolving into the melt and oxygen evolving from the surface and being taken up in the growing ingot. The level of uptake in the ingot is a function of the equilibrium oxygen concentration in the melt. In a conventional crucible the ratio of melt surface area to melt area in contact with quartz is relatively small (<1), such that the equilibrium oxygen concentration is relatively high. By contrast, in a low aspect ratio crucible the ratio is close to unity and thus the equilibrium oxygen concentration is relatively low with attendant benefits to minority carrier lifetime and cell photovoltaic conversion efficiency. The use of a weir or weirs of course increases the surface area of contact between melt and quartz surfaces. Thus, it is especially important to use a low aspect ratio crucible when using a single weir, as shown in FIGS. 2 and 3, and such a low aspect ratio crucible is even more important when using a double weir as in FIG. 4.

Figure 5:
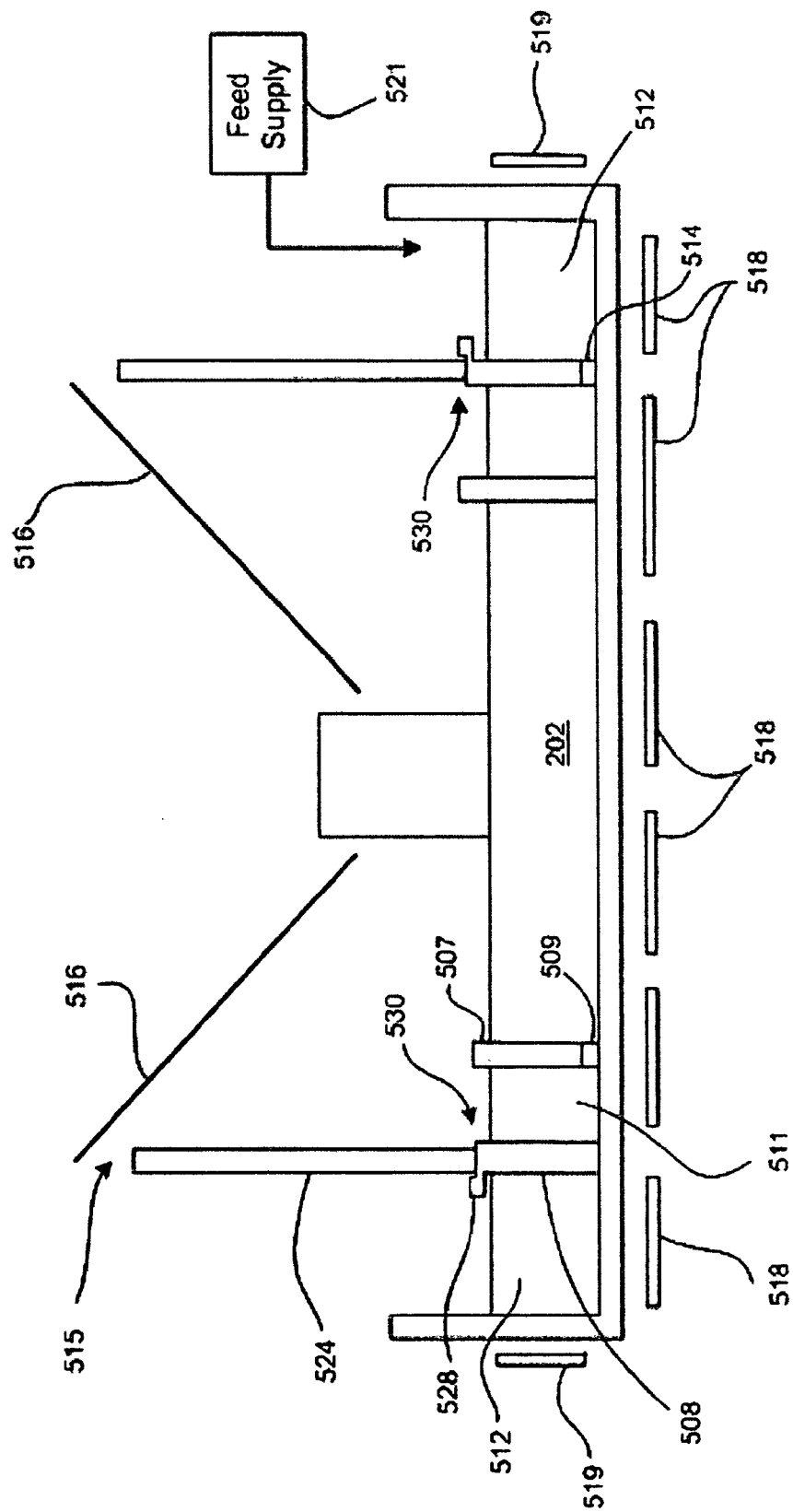
FIG. 5 is a schematic diagram showing a side sectional view of a modular, reusable weir supportably engaged with an outer (and I or inner) weir in accordance with an aspect of the invention.

Referring to FIG. 5, another aspect of the invention provides a reusable, modular weir 524 comprising preferably molybdenum or other similar material. The modular weir 524 alternatively may comprise conventional material such as quartz coated with barium or other devitrification promoter for additional protection against the formation of contaminants.

The modular weir 524 is preferably provided for removable engagement with an outer weir 508, but also could be used with an inner weir 507. Outer and inner weirs 508 and 507, respectively, define outer melt region 512 and interconnecting region 511 as explained with reference to FIG. 4. Weirs 508 and 507 are also provided with one or more submerged flow controlling passageways 514 and 509 connecting the melt region 512 to the inner growth region 510 for controlling the flow of melt and effectively increasing the path length for molten silicon feedstock to travel between the outer melting region 512 and the central growth region 510 to provide improved melting of solid particles of feedstock. Solid silicon feedstock is provided to silicon melt 502 from feed supply 521 which may comprise a feedstock reservoir and tube of appropriate diameter for providing the feedstock to the melt region 512. Independently controllable base heaters 518 are also provided for compensating for the insulating effect of the two weirs 507 and 508 as described with reference to FIG. 4.

The modular weir 524 is supportably mounted on an outer (and I or inner) weir to create an extended weir. The sides of the modular weir extend vertically and in substantially coextensive cylindrical alignment with the supporting weir. Engagement means are provided for engaging the base of modular weir 524 with the supporting top surface of weir 508 for removable engagement of the modular weir. Such means for engagement may comprise for example annular lip 528 provided around the upper surface of weir 508 that provides a supporting base or surface for the engagement of the modular weir. Annular lip 528 acts as a supporting surface that enables the corresponding base of modular weir 524 to be clamped, supported or otherwise engaged with weir 508. Alternately, the base 530 of the modular weir 524 may be provided with any convenient means for engagement such as, for example, an annular recess or projection for threaded engagement with the corresponding annular lip the weir 508.

The supporting surface of weir 508 is positioned such that the base 530 of modular weir 524 is preferably above the surface of the melt. Modular weir 524 extends vertically in coaxial alignment with the supporting main weir forming an annular gap 515 of optimal width with respect to adjacent heat shield 516 with the advantages as previously described. Annular gap 515 may be optimized in width to provide a constricted passageway for substantially eliminating transport of dust particles into the growth chamber that would cause dislocation defects in the growing crystal.

It will be appreciated that the modular weir 524 is removable and thus may be reused over multiple ingot growing cycles. In addition, in the event that the melt freezes and expands, possibly damaging the main weir, the modular weir can be reused. The modular weir 524 provides the advantage of considerable cost savings in constructing a tall weir for defining an optimal annular gap with the heat shield. The modular weir may comprise half or more of the height and thus surface area of the tall weir, yet has an extended operational lifetime. In contrast, the supporting weir, immersed in the silicon melt, would need to be replaced more often due to the highly corrosive nature of molten silicon. The modular weir thus effectively increases the overall height of the weirs to create an optimal annular gap, while minimizing the surface area of the main weir. This may enable the cost effective use of other materials, such as increased thickness of a barium or other coating provided on the weir surface in contact with the melt to further reduce influx of contaminants.

While the invention has been described in connection with what are presently considered to be the most practical and preferred embodiments, it is to be understood that the invention is not limited to the disclosed embodiments and alternatives as set forth above, but on the contrary is intended to cover various modifications and equivalent arrangements included within the scope of the following claims.

For example, the second inner weir also can be used in conjunction with a short outer weir. This arrangement would save costs compared to the use of a tall outer weir. The second inner weir, or both weirs, also may be coated with a devitrification promoter such as barium carbonate. The use of a devitrification promoter for the weirs would improve zero dislocation performance in the crystal and would make the weirs substantially impervious to slumping or loss of mechanical support due to high temperatures associated with molten silicon.

Other compositions for the weirs and configurations for an elongated flow path for molten silicon from the melt region to the growth region to create a thermal buffer for protecting the growth region are possible. What is important is that the flow path provides a thermal buffer resulting in a more uniform ingot with reduced dislocations and higher photovoltaic conversion efficiency when used in solar cell applications. Therefore, persons of ordinary skill in this field are to understand that all such equivalent arrangements and modifications are to be included within the scope of the following claims.

What is claimed:

1. A method for continuous CZ crystal growing wherein one or more crystal ingots are pulled into a growth chamber from a crystal/melt interface defined in a crucible containing molten crystalline material that is continuously replenished by crystalline feedstock, the method comprising:

separating the molten crystalline material into an inner growth region surrounding the crystal/melt interface and an outer region for receiving the crystalline feedstock, wherein separating the molten crystalline material includes providing a weir supported on the base of the crucible;

controlling the flow of the molten crystalline material by increasing path distance and time for crystalline feedstock to travel between the outer region and the inner growth region, wherein controlling the flow of the molten crystalline material includes providing an inner weir within the weir such that the inner weir defines an interconnecting region between the inner growth region and the outer region; and defining an annular space with respect to sidewalls of a heat shield in the growth chamber such that the annular space substantially restricts entry of dust into the growth region.

2. The method of claim 1 further comprising circulating a purge gas about the growing ingot in the growth chamber such that the purge gas flows over the surface of the melt and exits through the annular space to sweep away silicon oxides from the melt.

3. The method of claim 1 further comprising receiving the crystalline feedstock in the outer region.

4. The method of claim 1 wherein the heat shield is a conical heat shield including a base with downwardly depending walls extending into the growth chamber at an angle with respect to the ingot, the walls tapering to a cone shape having a peripheral end, the peripheral end having a smaller diameter than the base and defining an annular opening dimensioned for receiving the ingot drawn from the melt/crystal interface.

5. The method of claim 1 wherein the weir comprises cylindrical sidewalls extending vertically to a first height closely spaced apart from the heat shield, and the sidewalls having a portion extending further outwardly in substantially parallel concentric alignment with the adjacent heat shield to a second height, wherein the outwardly extending sidewalls define a closely spaced parallel concentric annular gap with respect to the heat shield.

6. The method of claim 5 further comprising directing a flow of purge gas away from the growing ingot and into the annular gap at a velocity sufficient to overcome entry of dust particles into the growth region.

7. The method of claim 6 further comprising dimensioning the annular gap to increase an outflow purge gas pressure to substantially restrict the entry of dust into the growth region.

8. The method of claim 7 including dimensioning the annular gap between 5 mm to 20 mm in length.

9. The method of claim 8 further comprising activating a vacuum to draw a stream of the purge gas through the annular gap from the inner growth region to the outer region.

10. The method of claim 9 further comprising providing a plurality of heaters beneath the crucible.

11. The method of claim 9 further comprising providing a plurality of heaters beneath the crucible in a radial pattern.

12. The method of claim 1 wherein the inner weir has a lower height than the weir.

13. The method of claim 12 wherein the weir and the inner weir each comprise a passageway configured to allow the molten crystalline material to flow therethrough.

14. The method of claim 13 wherein the passageway of the weir and the passageway of the inner weir are offset with respect to one another.

15. The method of claim 12 wherein the heat shield further comprises second downwardly depending walls disposed substantially parallel with the weir.

16. The method of claim 12 wherein the weir includes a devitrification promoter.

17. The method of claim 12 wherein the crucible has a wider aspect ratio than the weir.

* * * * *